(12) United States Patent
Emoto et al.

(10) Patent No.: US 12,216,410 B2
(45) Date of Patent: Feb. 4, 2025

(54) EXPOSURE APPARATUS AND METHOD OF MANUFACTURING ARTICLE

(71) Applicant: CANON KABUSHIKI KAISHA, Tokyo (JP)

(72) Inventors: Keiji Emoto, Saitama (JP); Mamoru Kaneishi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/233,920

(22) Filed: Aug. 15, 2023

(65) Prior Publication Data

US 2023/0393486 A1 Dec. 7, 2023

Related U.S. Application Data

(63) Continuation of application No. 17/858,263, filed on Jul. 6, 2022, now Pat. No. 11,762,299.

(30) Foreign Application Priority Data

Jul. 13, 2021 (JP) ................. 2021-115831

(51) Int. Cl.
*G03F 7/20* (2006.01)
*G03F 7/00* (2006.01)
(52) U.S. Cl.
CPC ...... *G03F 7/70358* (2013.01); *G03F 7/70725* (2013.01); *G03F 7/70758* (2013.01); *G03F 7/70775* (2013.01)
(58) Field of Classification Search
CPC ............. G03F 7/70358; G03F 7/70725; G03F 7/70758; G03F 7/70775
See application file for complete search history.

(56) References Cited

U.S. PATENT DOCUMENTS

| | | |
|---|---|---|
| 2004/0160592 A1 | 8/2004 | Iwanaga |
| 2008/0218715 A1 | 9/2008 | Hatano |
| | (Continued) | |

FOREIGN PATENT DOCUMENTS

| | | |
|---|---|---|
| CN | 109562902 A | 4/2019 |
| JP | 2010-016166 A | 1/2010 |
| | (Continued) | |

OTHER PUBLICATIONS

Extended European Search Report issued in corresponding EP Patent Application No. 22181796.8, dated Dec. 7, 2022, pp. 1-8.

(Continued)

*Primary Examiner* — Mesfin T Asfaw
(74) *Attorney, Agent, or Firm* — Carter, DeLuca & Farrell LLP

(57) ABSTRACT

The present invention provides an exposure apparatus for performing scanning exposure on each of a plurality of shot regions in a substrate, comprising: a stage configured to hold the substrate; a driver configured to drive the stage; and a controller configured to control the scanning exposure on each of the plurality of shot regions while controlling the driver in accordance with a driving profile, wherein the driving profile includes a first section in which the stage is driven at a constant acceleration in a first direction, a second section in which the stage is driven at a constant acceleration in a second direction opposite to the first direction, and a connection section connecting the first section and the second section, and a period in which the scanning exposure is performed includes at least a part of the connection section.

16 Claims, 11 Drawing Sheets

(56) References Cited

U.S. PATENT DOCUMENTS

2008/0275661 A1   11/2008  Yang
2011/0123934 A1   5/2011   Asaishi
2012/0170008 A1   7/2012   Emoto et al.

FOREIGN PATENT DOCUMENTS

| JP | 2010-272673 A | 12/2010 |
| JP | 2012-142463 A | 7/2012 |
| JP | 5406861 B | 2/2014 |
| JP | 2015-201526 A | 11/2015 |

OTHER PUBLICATIONS

TW Office Action issued in corresponding TW Patent Application No. 111125273, dated Aug. 14, 2024, pp. 1-18, with English translation.

Korean Office Action issued in corresponding KR Patent Application No. 10-2022-0079334, dated Nov. 22, 2024, with English translation.

FIG. 2
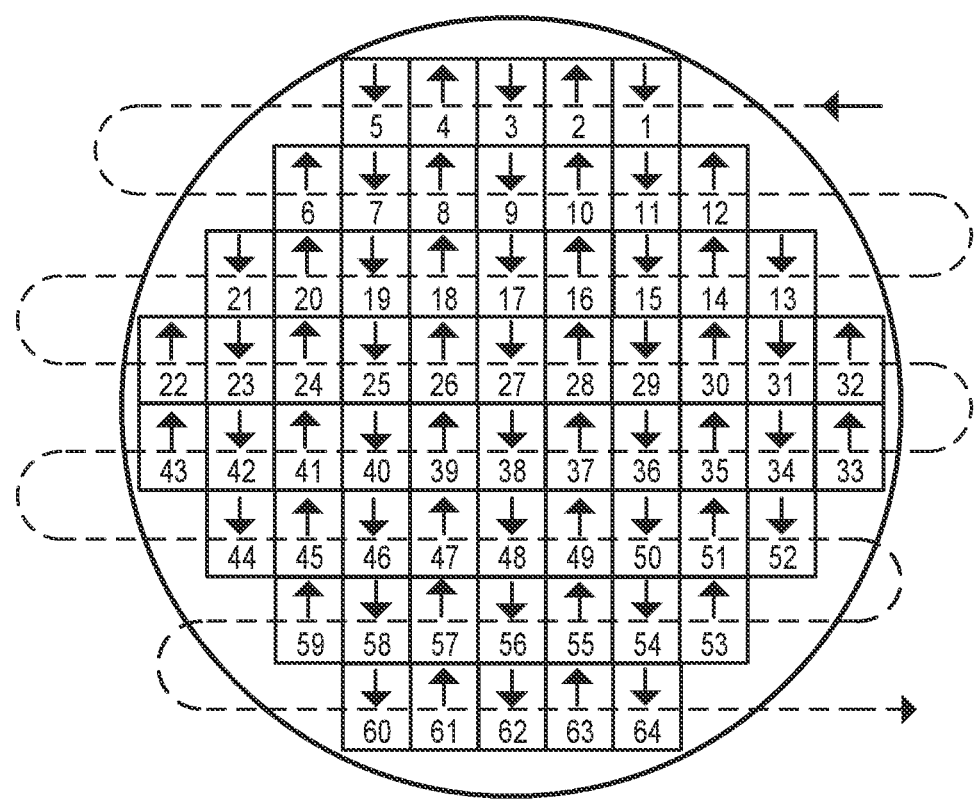
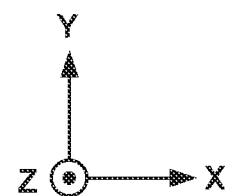

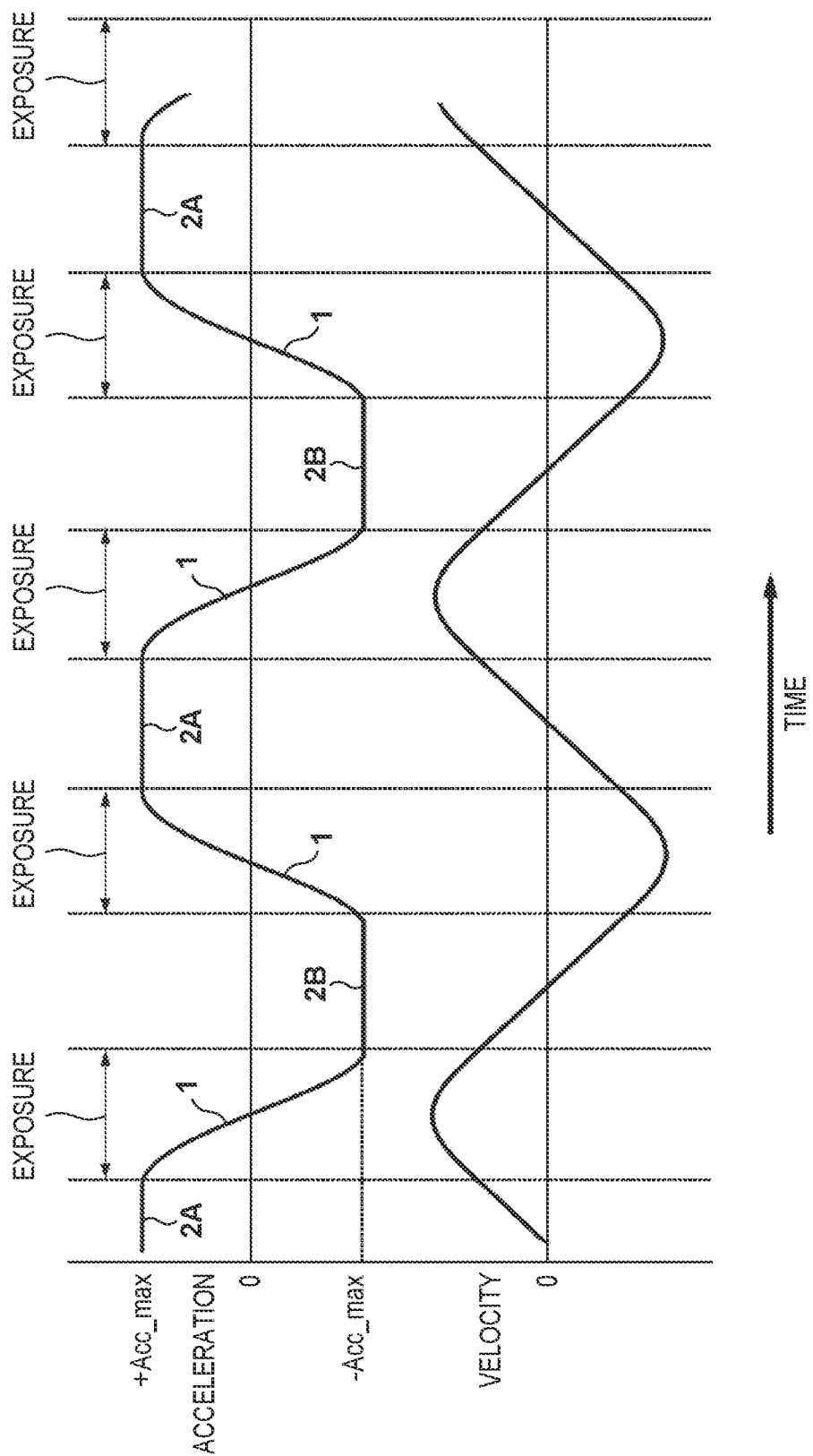

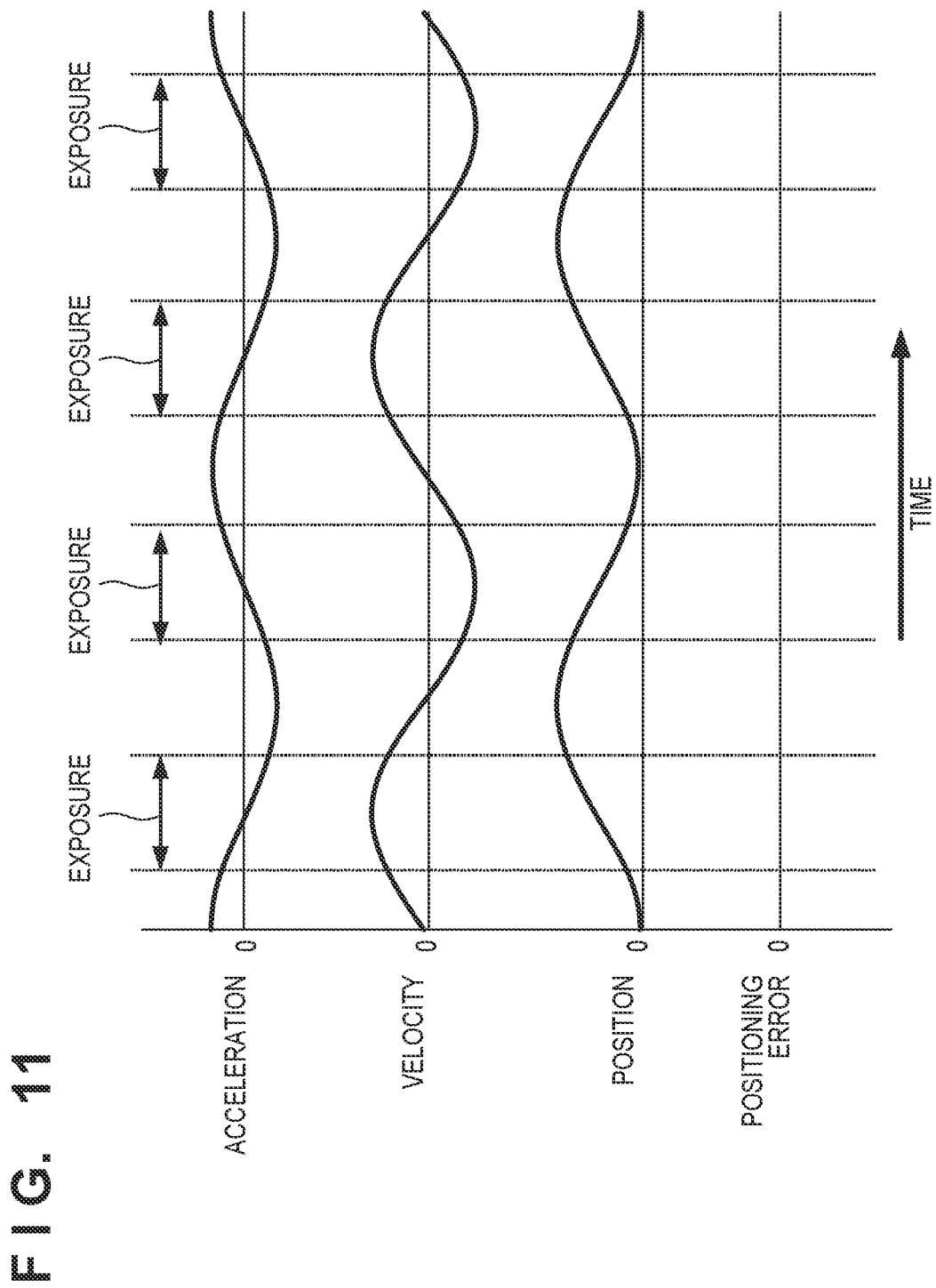

EXPOSURE APPARATUS AND METHOD OF MANUFACTURING ARTICLE

This application is a continuation of U.S. patent application Ser. No. 17/858,263, filed on Jul. 6, 2022, which claims the benefit of and priority to Japanese Patent Application No. 2021-115831, filed on Jul. 13, 2021, each of which is hereby incorporated by reference herein in their entirety.

BACKGROUND OF THE INVENTION

Field of the Invention

The present invention relates to an exposure apparatus and a method of manufacturing an article.

Description of the Related Art

As a lithography apparatus used in a manufacturing process of a semiconductor device or the like, there is known an exposure apparatus (so-called scanning exposure apparatus) that exposes a substrate while relatively scanning an original and the substrate via a projection optical system, thereby transferring the pattern of the original onto the substrate. Such an exposure apparatus generally performs scanning exposure of a substrate while moving the substrate at a constant velocity. However, in order to improve the throughput (productivity), it is desired that scanning exposure of the substrate be performed while accelerating and/or decelerating the substrate. Japanese Patent No. 5406861 proposes a technique of, while moving a substrate in accordance with an acceleration profile formed by a sine wave, exposing the substrate in a section in which each of the acceleration and velocity of the substrate changes as a sine wave. Further, Japanese Patent Laid-Open No. 2010-16166 proposes a technique of exposing a substrate during constant acceleration, that is, in a section in which the velocity changes linearly.

In a case in which the acceleration profile of a substrate described in each of Japanese Patent No. 5406861 and Japanese Patent Laid-Open No. 2010-16166 is applied to a scanning exposure apparatus, it is possible to reduce the positioning error of the substrate during scanning exposure of the substrate, but there is room for improvement in terms of the throughput such as performing scanning exposure in a shorter time.

SUMMARY OF THE INVENTION

The present invention provides, for example, an exposure apparatus that can improve the throughput while reducing the positioning error of a substrate during scanning exposure.

According to one aspect of the present invention, there is provided an exposure apparatus for performing scanning exposure on each of a plurality of shot regions in a substrate, comprising: a stage configured to hold the substrate; a driver configured to drive the stage; and a controller configured to control the scanning exposure on each of the plurality of shot regions while controlling the driver in accordance with a driving profile for driving the stage, wherein the driving profile includes a first constant acceleration section in which the stage is driven at a constant acceleration in a first direction, a second constant acceleration section in which the stage is driven at a constant acceleration in a second direction opposite to the first direction, and a connection section connecting the first constant acceleration section and the second constant acceleration section such that an acceleration of the stage continuously changes, and a period in which the scanning exposure is performed includes at least a part of the connection section.

Further features of the present invention will become apparent from the following description of exemplary embodiments with reference to the attached drawings.

BRIEF DESCRIPTION OF THE DRAWINGS

FIG. 2 is a view showing an example of the locus of movement of a substrate stage;

FIG. 10 is a view showing the driving profile of the second embodiment; and

FIG. 11 is a view showing the driving profile of the related art.

DESCRIPTION OF THE EMBODIMENTS

Figure 1:
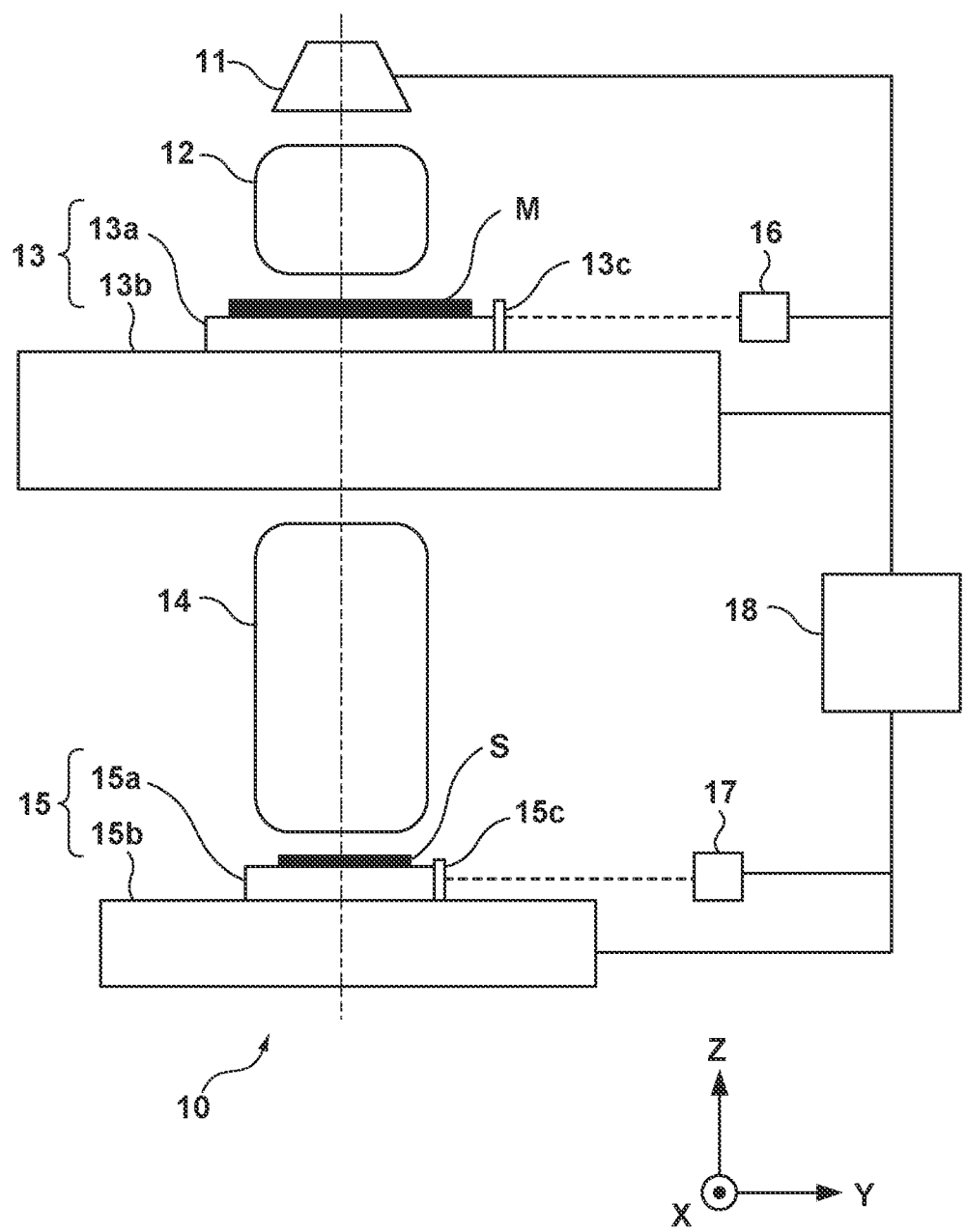
FIG. 1 is a schematic view showing the arrangement of an exposure apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

The first embodiment according to the present invention will be described. In the specification and the accompanying drawings, directions will be indicated on an XYZ coordinate system in which a horizontal surface is defined as the X-Y plane. In general, a substrate S serving as an exposure target substrate is placed on a substrate stage such that the surface of the substrate S becomes parallel to the horizontal surface (X-Y plane). Accordingly, in a following description, two directions orthogonal to each other in the plane along the surface of the substrate S are defined as the X-axis direction and the Y-axis direction, and the direction perpendicular to the X-axis direction and the Y-axis direction is defined as the Z-axis direction. In the following description, the "X-axis direction" can be defined to include the +X direction and the −X direction. This also applies to the "Y-axis direction" and the "Z-axis direction". Note that in this embodiment, the direction (scanning direction) of relatively scanning an original M and the substrate S is defined as the Y-axis direction (+Y direction or −Y direction).

FIG. 1 is a schematic view showing the arrangement of an exposure apparatus 10 of this embodiment. The exposure apparatus 10 can include a light source 11, an illumination optical system 12, an original holding mechanism 13, a projection optical system 14, and a substrate holding mechanisms 15. The exposure apparatus 10 can also include a first detector 16, a second detector 17, and a controller 18. The controller 18 is formed by a computer including a processor such as a CPU (Central Processing Unit), a memory, and the like, and controls the respective units of the exposure apparatus 10. That is, the controller 18 controls the process of transferring the pattern formed on the original M to the substrate S while relatively scanning the original M (for example, a reticle or a mask) and the substrate S (for example, a wafer or a glass plate), that is, scanning exposure of the substrate S. Note that in this embodiment, the light source 11 is provided as a component of the exposure apparatus 10, but the light source 11 may not be a component of the exposure apparatus 10.

The illumination optical system 12 shapes light emitted from the light source 11 such as an excimer laser into, for example, band-like or arcuate exposure light (slit-shaped light) long in the X-axis direction by using a light shielding member such as a masking blade included in the illumination optical system 12, and illuminates a portion of the original M with the exposure light. The original M and the substrate S are held by the original holding mechanism 13 and the substrate holding mechanism 15, respectively, and are arranged in optically conjugate positions (the object plane and image plane of the projection optical system 14) via the projection optical system 14. The projection optical system 14 has a predetermined projection magnification, and projects the pattern formed on the original M onto the substrate by using the exposure light.

The original holding mechanism 13 can include, for example, an original stage 13a that holds the original M using a vacuum force, an electrostatic force, or the like, and an original driving unit (driver) 13b that drives the original stage 13a (original M). The original driving unit 13b includes, for example, an actuator such as a linear motor, and can be configured to drive the original stage 13a (original M) in the X-axis direction, the Y-axis direction, the Z-axis direction, and the rotational directions around the respective axes. Accordingly, the original driving unit 13b can drive the original stage 13a (original M) in the Y-axis direction (+Y direction or −Y direction) as the scanning direction during scanning exposure of the substrate S. The position of the original stage 13a can be detected by the first detector 16. The first detector 16 includes, for example, a laser interferometer. The first detector 16 can emit a laser beam toward a reflector 13c provided on the original stage 13a, and detect the position of the original stage 13a using the laser beam reflected by the reflector 13c. Note that the laser interferometer is used in the first detector 16 of this embodiment, but the present invention is not limited to this and, for example, an encoder may be used.

The substrate holding mechanism 15 can include, for example, a substrate stage 15a that holds the substrate S using a vacuum force, an electrostatic force, or the like, and a substrate driving unit 15b that drives the substrate stage 15a (substrate S). The substrate driving unit 15b includes, for example, an actuator such as a linear motor, and can drive the substrate stage 15a (substrate S) in the X-axis direction, the Y-axis direction, the Z-axis direction, and the rotational directions around the respective axes. Accordingly, the substrate driving unit 15b can drive the substrate stage 15a (substrate S) in the Y-axis direction (+Y direction or −Y direction) as the scanning direction during scanning exposure of the substrate S. The position of the substrate stage 15a can be detected by the second detector 17. The second detector 17 includes, for example, a laser interferometer. The second detector 17 can emit a laser beam toward a reflector 15c provided on the substrate stage 15a, and detect the position of the substrate stage 15a using the laser beam reflected by the reflector 15c. Note that the laser interferometer is used in the second detector 17 of this embodiment, but the present invention is not limited to this and, for example, an encoder may be used.

In the exposure apparatus 10 configured as described above, during scanning exposure of the substrate S, the original driving unit 13b and the substrate driving unit 15b relatively scan the original stage 13a and the substrate stage 15a in the Y-axis direction at a velocity ratio matching the projection magnification of the projection optical system 14. With this, the pattern on the original M can be transferred onto a shot region (more specifically, the resist (photosensitive material) on the shot region) of the substrate S. By sequentially repeating the scanning exposure as described above for each of a plurality of shot regions in the substrate S, an exposure process on one substrate S can be completed.

FIG. 2 is a view showing an example of the locus of movement of the substrate stage 15a as the relative movement of the projection optical system 14 with respect to the substrate S. FIG. 2 shows the array (shot layout) of the plurality of shot regions in the substrate S. In the example shown in FIG. 2, the substrate S includes 64 shot regions. The number in each shot region indicates the count (exposure order) of the shot region, and an arrow in each shot region indicates the scanning direction of the substrate stage 15a (substrate S) during scanning exposure of each shot region. A dashed line schematically indicates the movement direction upon performing step movement of the substrate stage 15a among the shot regions. For example, giving attention to the first and second shot regions, after scanning exposure is performed on the first shot region while scanning the substrate stage 15a in the −Y direction, step movement of the substrate stage 15a in the −X direction is performed before exposure of the second shot region is started. Then, after the step movement is completed, scanning exposure of the second shot region is performed while scanning the substrate stage 15a (substrate S) in the +Y direction.

Here, as a conventional exposure technique, as shown in FIG. 11, a technique may be used in which, while moving a substrate in accordance with an acceleration profile formed by a sine wave, a substrate is exposed in a section in which each of the acceleration and velocity of the substrate changes as a sine wave. Such a technique is sometimes referred to as sine wave exposure, and is advantageous in terms of improvement of the throughput (productivity). However, in the conventional exposure technique (sine wave exposure), the positioning error of the substrate during scanning exposure of the substrate can be reduced, but there is room for improvement in terms of the throughput such as scanning exposure in a shorter time.

The exposure apparatus 10 of this embodiment controls scanning exposure on each of the plurality of shot regions in the substrate S while controlling the substrate driving unit 15b in accordance with the driving profile for driving the substrate stage 15a in the Y-axis direction. This driving profile can be formed (set) so as to be capable of improving the throughput while reducing the positioning error of the substrate S. A configuration example of the driving profile applied to the exposure apparatus 10 of this embodiment will be described below. Note that the driving profile may be understood to include an acceleration profile, a velocity profile, and a position profile.

Example 1

Figure 3:
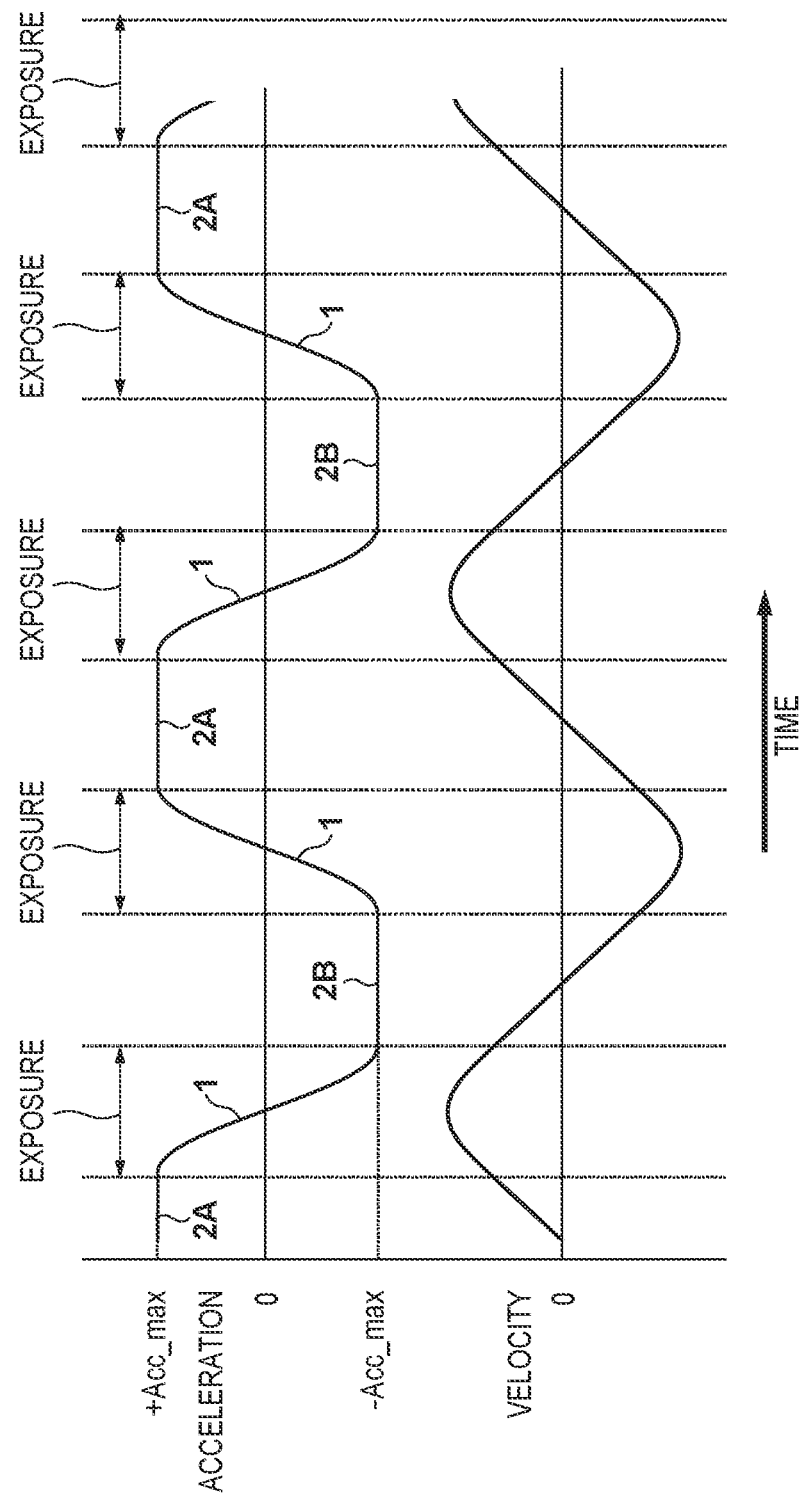
FIG. 3 is a view showing the driving profile of the first embodiment (Example 1)

Example 1 of the driving profile applied to the exposure apparatus 10 of this embodiment will be described. FIG. 3 is a view showing an example of the driving profile for controlling driving of the substrate stage 15a in the Y-axis direction in the exposure apparatus 10 of this embodiment. FIG. 3 shows only a part of the driving profile used in scanning exposure on the plurality of shot regions of the substrate S. In FIG. 3, the acceleration profile which indicates the temporal transition of the acceleration of the substrate stage 15a is shown in the upper stage, and the velocity profile which indicates the temporal transition of the velocity of the substrate stage 15a is shown in the lower stage. Note that the driving profile of the substrate stage 15a will be described below, but a similar configuration may be applied to the driving profile of the original stage 13a.

The driving profile (acceleration profile) shown in FIG. 3 is formed by a first constant acceleration section 2A, a second constant acceleration section 2B, and a connection section 1 connecting them. Scanning exposure of one shot region is performed in a period including at least a part of the connection section 1.

The first constant acceleration section 2A is a section in which the substrate stage 15a is driven in a first direction at a constant acceleration. The second constant acceleration section 2B is a section in which the substrate stage 15a is driven in a second direction opposite to the first direction at the constant acceleration. The first direction is one of the +Y direction and the −Y direction, and the second direction is the other one of the +Y direction and the −Y direction. From the viewpoint of improving the throughput, the absolute value of the acceleration of the substrate stage 15a in the first constant acceleration section 2A and/or the second constant acceleration section 2B can be set to a maximum acceleration Acc_max at which the substrate driving unit 15b can drive the substrate stage 15a.

The connection section 1 is a section provided between the first constant acceleration section 2A and the second constant acceleration section 2B in which the driving acceleration directions are different from each other, and connecting the first constant acceleration section 2A and the second constant acceleration section 2B such that the acceleration of the substrate stage 15a changes continuously and smoothly (gradually). In the example shown in FIG. 3, when connecting from the first constant acceleration section 2A to the second constant acceleration section 2B, the connection section 1 is a section in which the acceleration is monotonically changed (decreased) such that the slope (derivative coefficient) of the acceleration becomes negative. When connecting from the second constant acceleration section 2B to the first constant acceleration section 2A, the connection section 1 is a section in which the acceleration is monotonically changed (increased) such that the slope (derivative coefficient) of the acceleration becomes positive. The connection section 1 may be understood as a section connecting the first constant acceleration section 2A and the second constant acceleration section 2B with a curve so as not to include a period (constant velocity period) in which the substrate stage 15a moves at a constant velocity. Further, the connection section 1 can be formed in a point-symmetric curved shape with the center point of the connection section 1 as the point of symmetry. In Example 1, the connection section 1 can be formed such that the acceleration of the substrate stage 15a changes in a sine wave shape. The driving profile (acceleration profile) including such the connection section 1 is formed by a differentiable curve in its entire range. Therefore, when the substrate stage 15a is driven in accordance with this driving profile, an abrupt change of the acceleration is suppressed, and the positioning error of the substrate stage 15a during scanning exposure can be reduced.

In order to enable positioning of the substrate stage 15a with high accuracy, the frequency of the waveform (sine wave) of the acceleration in the connection section 1 can be set to a frequency equal to or lower than the bandwidth of the control system of driving of the substrate stage 15a by the substrate driving unit 15b. With this, the driving profile that facilitates positioning control of the substrate stage 15a is obtained. Thus, it is possible to suppress, to the minimum, the positioning error of the substrate stage 15a that can occur when the acceleration abruptly changes between the first constant acceleration section 2A and the second constant acceleration section 2B. That is, it is possible to implement scanning exposure with high accuracy during acceleration/deceleration.

Here, the driving profile (acceleration profile) in the connection section 1 in Example 1 is not limited to a single sine wave, and may be formed by a plurality of sine waves. Further, the driving profile in the connection section 1 may be formed by overlapping a plurality of sine waves having different frequencies, or may be formed by connecting the plurality of sine waves divided at time intervals. Also in this case, the frequency of each of the plurality of sine waves can be equal to or lower than the bandwidth of the control system of the substrate stage 15a. From the viewpoint of improving the positioning accuracy of the substrate stage 15a, it is desirable that the first constant acceleration section 2A and the second constant acceleration section 2B are connected continuously and smoothly by the connection section 1 so that the driving profile is differentiable in the entire range.

In Example 1, scanning exposure of one shot region is performed in the connection section 1, and step movement of the substrate stage 15a in the X-axis direction between the shot regions is performed in the first constant acceleration section 2A or the second constant acceleration section 2B. As has been described above with reference to FIG. 2, in the exposure apparatus 10, an operation is repeatedly performed in which after scanning exposure of the shot region is performed while scanning the substrate stage 15a in the Y-axis direction, step movement to the next shot region adjacent in the X-axis direction is performed, and scanning exposure of the next shot region is performed. Therefore, the driving profile of Example 1 shown in FIG. 3 is a profile in which the connection section 1 and the constant acceleration section (2A or 2B) are alternately and repeatedly arrayed so that scanning exposure can be performed continuously on the plurality of shot regions in the substrate S.

In Example 1, scanning exposure of the shot region is performed in the connection section 1 in which the acceleration of the substrate stage 15a changes in a sine wave shape. Accordingly, the velocity of the substrate stage 15a during scanning exposure also changes in a sine wave shape, and the exposure time (that is, the exposure amount) can change accordingly for each position in the shot region in the scanning direction. Therefore, in order to make the exposure amount in the shot region constant (uniform), the illuminance of the substrate S (that is, the intensity of light applied to the substrate S) can be changed in accordance with the velocity of the substrate stage 15a. For example, by adjusting the light source 11 such that the illuminance of the substrate S changes in accordance with the velocity of the substrate stage 15a, the exposure amount in the shot region can be made constant (uniform). More specifically, when the velocity of the substrate stage 15a is high, the light source 11 can be adjusted to decrease the illuminance of the substrate S. When the velocity of the substrate stage 15a is low, the light source 11 can be adjusted to increase the illuminance of the substrate S.

Figure 4:
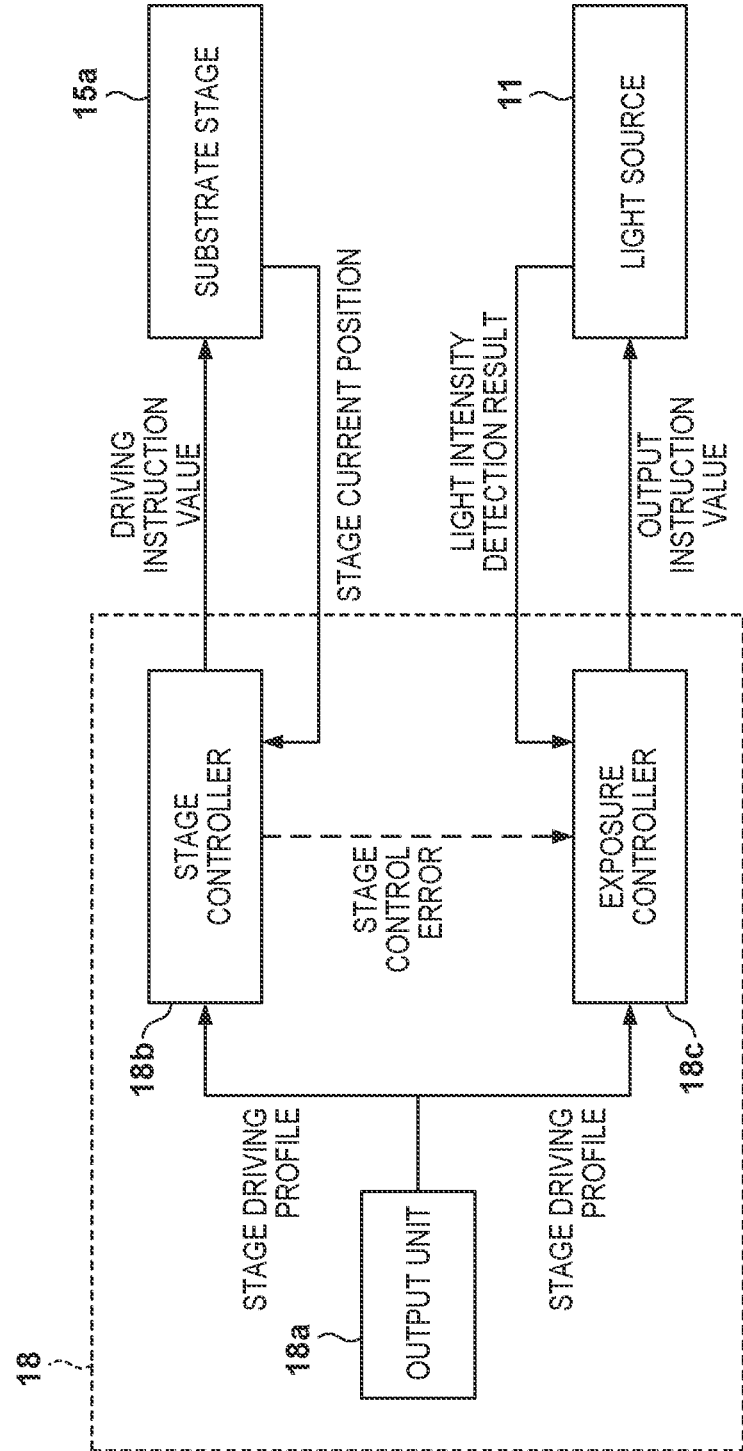
FIG. 4 is a block diagram schematically showing a control system of the substrate stage and a light source.

FIG. 4 is a block diagram schematically showing the control system of the substrate stage 15a and the light source 11. The controller 18 can include an output unit 18a that outputs the above-described driving profile, a stage controller 18b that controls driving of the substrate stage 15a, and an exposure controller 18c that controls the exposure amount of the substrate S. Here, the output unit 18a may be configured to acquire the driving profile generated by an external computer of the exposure apparatus 10, or may be configured to generate the driving profile based on information indicating the array and dimension of the plurality of shot regions in the substrate S.

The stage controller 18b controls driving of the substrate stage 15a based on the driving profile output from the output unit 18a. The stage controller 18b includes, for example, a PID compensator, and calculates a driving instruction value for driving the substrate stage 15a based on the deviation between the target position of the substrate stage 15a in the driving profile and the current position of the substrate stage 15a detected by the second detector 17. Then, the calculated driving instruction value is supplied to the substrate driving unit 15b. Thus, the stage controller 18b can control driving of the substrate stage 15a in accordance with the driving profile. In addition, the stage controller 18b can obtain the control error of the substrate stage 15a based on the deviation between the current position and target position of the substrate stage 15a. The control error of the substrate stage 15a may be understood as the control deviation of the substrate stage 15a, and can include, for example, the velocity deviation and/or acceleration deviation of the substrate stage 15a.

The exposure controller 18c controls, based on the target velocity of the substrate stage 15a in the driving profile output from the output unit 18a, the output of the light source 11 (that is, the intensity of light emitted from the light source 11) such that the exposure amount of the substrate S becomes the target exposure amount. When performing PWM (Pulse Width Modulation) control of the light source 11, the exposure controller 18c may control the width and interval of the pulse train supplied to the light source 11. In addition, the exposure controller 18c may perform feedback control of the output of the light source 11 based on the result obtained by detecting, by a sensor or the like, the intensity of light applied to the substrate S. Further, the exposure controller 18c may acquire information regarding the control error (for example, the velocity deviation or the acceleration deviation) of the substrate stage 15a from the stage controller 18b, and based on the information, adjust the output of the light source 11 so as to follow the actual velocity or acceleration of the substrate stage 15a.

Next, a verification result of the effect upon applying the driving profile of the substrate stage 15a in Example 1 will be described. For example, in the related art described in Japanese Patent No. 5406861, as shown in FIG. 11, scanning exposure for the plurality of shot regions is performed while driving the substrate stage in accordance with the driving profile in which the acceleration is generally changed in a sine wave shape. That is, in the driving profile of the related art, sections corresponding to the first constant acceleration section 2A and the second constant acceleration section 2B in the driving profile of Example 1 do not exist. In addition, in the driving profile of the related art, the highest priority is to reduce the positioning error of the substrate stage, and the sequential driving profile for performing scanning exposure on the plurality of shot regions can be generally formed in a sine wave shape having a frequency lower than the bandwidth of the substrate stage control system. Such the driving profile of the related art can reduce the positioning error of the substrate stage, but there is room for further reduction of the throughput.

Figure 5:
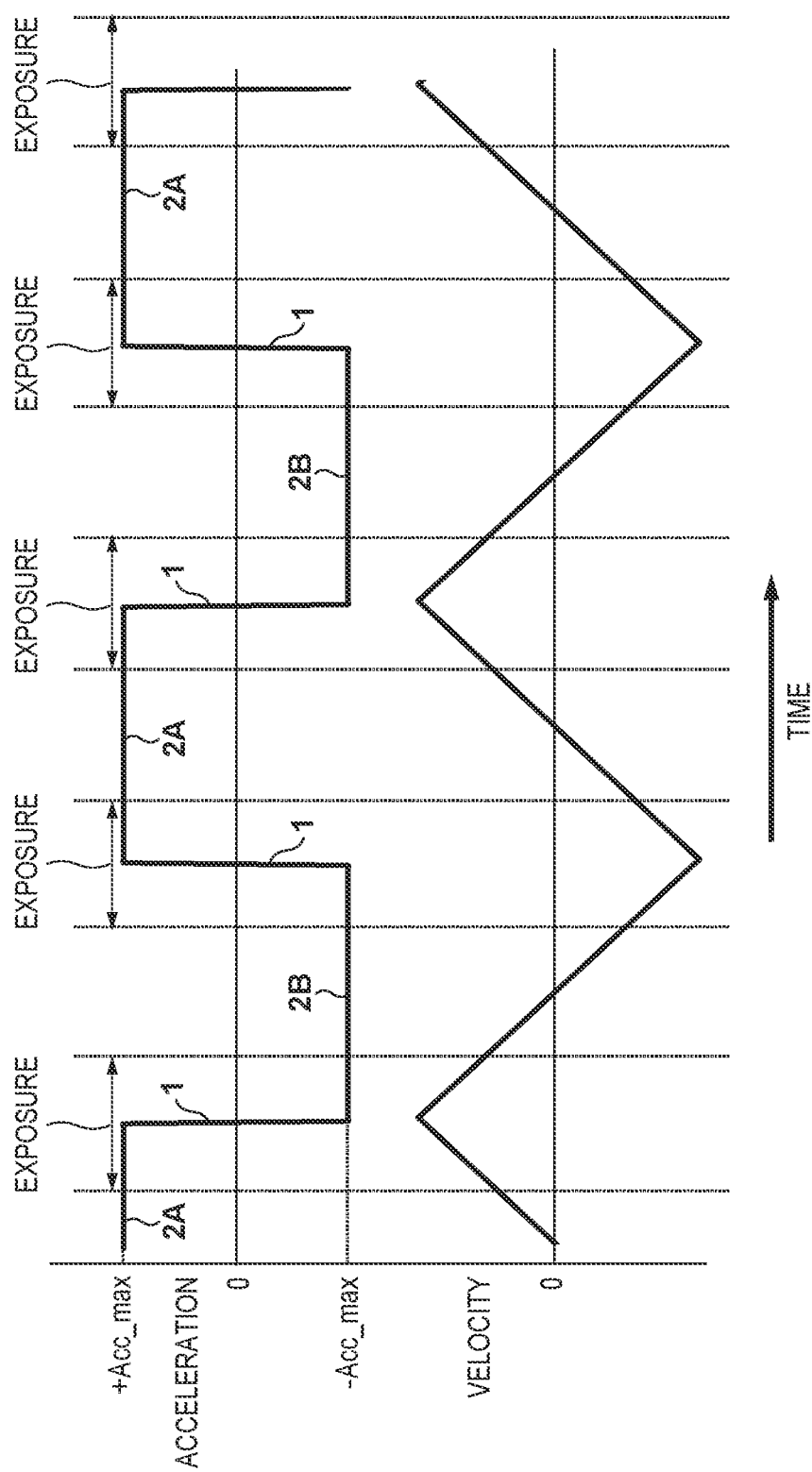
FIG. 5 is a view showing a shortest time driving profile.

On the other hand, FIG. 5 shows the driving profile formed so as to maximally improve the throughput in theory (to be sometimes referred to as the shortest time driving profile hereinafter). The shortest time driving profile shown in FIG. 5 includes the first constant acceleration section 2A and the second constant acceleration section 2B in which the acceleration of the substrate stage 15a is constant, but the time width of the connection section 1 is set to be minimum. The absolute value of the acceleration of the substrate stage 15a in the first constant acceleration section 2A and/or the second constant acceleration section 2B is set to the maximum acceleration Acc_max at which the substrate driving unit 15b can drive the substrate stage 15a. The shortest time driving profile as described above is a rectangular-wave profile formed such that the first constant acceleration section 2A and the second constant acceleration section 2B are switched stepwise, and the acceleration of the substrate stage 15a is not changed continuously and smoothly in the connection section 1. Therefore, when driving of the substrate stage 15a is controlled using the shortest time driving profile, the throughput can be improved but the positioning error of the substrate stage 15a increases. To summarize this, improvement of the throughput and the positioning error of the substrate stage 15a have a tradeoff relationship. That is, there is a tendency that as the time width of the connection section 1 is increased, the throughput decreases, and as the time width of the connection section 1 is decreased, the positioning error increases.

Comparing the shortest time driving profile shown in FIG. 5 with the driving profile of the related art shown in FIG. 11, in the driving profile of the related art (FIG. 11), there is almost no section in which the substrate stage is driven with the absolute value of acceleration being the maximum acceleration Acc_max. By calculating the driving time of the substrate stage 15a required to perform scanning exposure of one shot region for each of the driving profile shown in FIG. 5 and the driving profile shown in FIG. 11, it was found that the driving profile of the related art requires about 1.57 times the driving time of the shortest time driving profile. Note that the driving time of the substrate stage 15a required to perform scanning exposure of one shot region is sometimes referred to as the "stage driving time" hereinafter.

Figure 6:
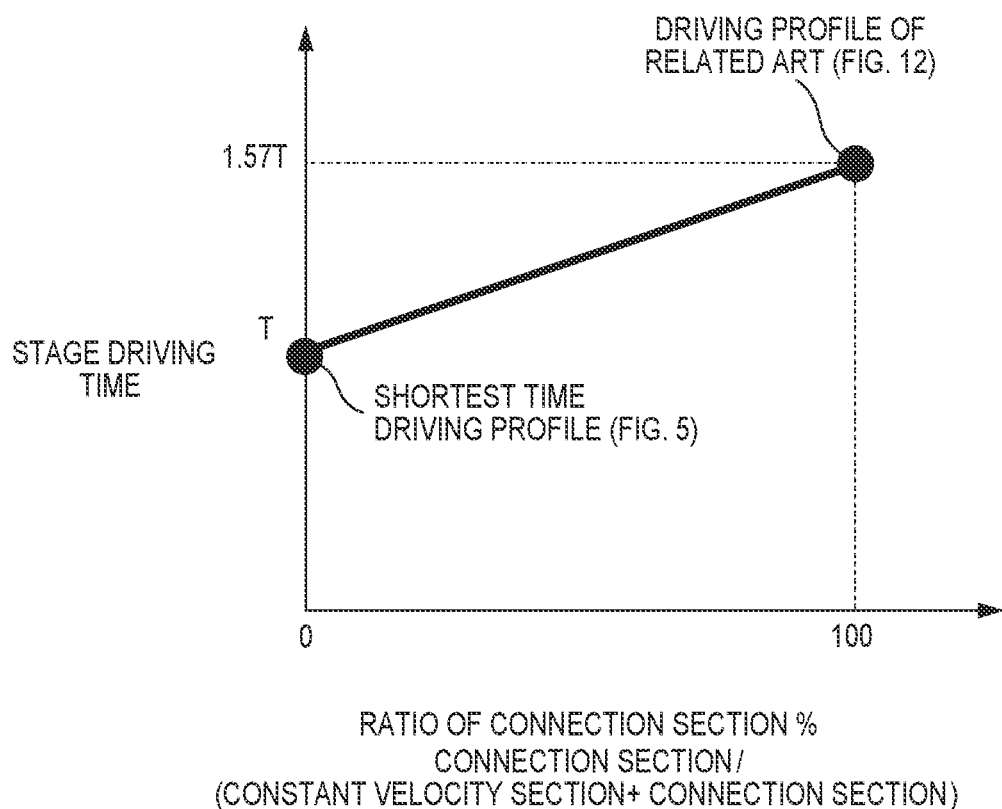
FIG. 6 is a view showing the relationship between the ratio of the connection section and the stage driving time.

FIG. 6 shows the relationship between the ratio of the connection section 1 (sine wave section) and the stage driving time. The ratio of the connection section 1 can be defined as the ratio of the time of the connection section 1 to the total time of one constant acceleration section (the first constant acceleration section 2A or the second constant acceleration section 2B) and the one connection section 1. When the substrate stage 15a is driven in accordance with the shortest time driving profile shown in FIG. 5, the ratio of the connection section 1 is 0%. The stage driving time in this case is defined as T. On the other hand, when the substrate stage 15a is driven in accordance with the driving profile of the related art shown in FIG. 11, the ratio of the connection section 1 is 100%, and the stage driving time is 1.57 T. That is, from the relationship shown in FIG. 6, it is found that as the ratio of the connection section 1 increases, the stage driving time increases and the throughput decreases.

On the other hand, when the ratio of the connection section 1 is 0% as in the shortest time driving profile shown in FIG. 5, control of the substrate stage 15a cannot follow the change in acceleration, so that the positioning error of the substrate stage 15a can increase. In general, a substrate stage used in an exposure apparatus is difficult to follow a driving profile having a frequency of 300 Hz or more. Since the rectangular-wave driving profile shown in FIG. 5 includes a high frequency component in the connection section 1, a large positioning error is likely to occur. In addition, a curve can be decomposed into a trigonometric series (Fourier series), and it is known that the lower the frequency of the trigonometric series included in the curve of the driving profile, the higher the control followability of the substrate stage 15a. A rectangular wave is theoretically formed by an infinite number of sine waves each having an infinitely high frequency, and the connection point between the connection section 1 and the constant acceleration section (the first constant acceleration section 2A or the second constant acceleration section 2B) is in a non-differentiable state. From these reasons, it is found that when the shortest time driving profile shown in FIG. 5 is used, the positioning error of the substrate stage 15a is likely to occur. Therefore, the connection section 1 can be formed such that, when the connection section 1 is decomposed into a trigonometric series (Fourier series), the frequency of the trigonometric series is equal to or lower than the bandwidth of the control system of the substrate stage 15a. This configuration can also be applied to the driving profile (FIG. 3) of Example 1.

As can be seen from the verification results described above, in the driving profile (FIG. 3) of Example 1, improvement of the throughput is achieved by providing the first constant acceleration section 2A and the second constant acceleration section 2B. In addition, reduction of the positioning error of the substrate stage 15a is achieved by forming the connection section 1 connecting the first constant acceleration section 2A and the second constant acceleration section 2B such that the acceleration of the substrate stage 15a continuously changes. That is, by using the driving profile of Example 1, it is possible to achieve both shortening of the stage driving time (improving the throughput) and reduction of the positioning error of the substrate stage 15a.

Here, in the driving profile of Example 1, the ratio of the connection section 1 is set to a value larger than 0% and smaller than 100%, preferably a value larger than 15% and smaller than 85%, and more preferably a value larger than 30% and smaller than 70%. Further, each of the first constant acceleration section 2A and the second constant acceleration section 2B can be set to at least ¹/₁₀ or more (alternatively, ⅕ or more, or ½ or more) with respect to the non-exposure period. The non-exposure period is a period between scanning exposure and the next scanning exposure. The non-exposure period may be understood as a period in which the substrate S is not exposed, that is, a period in which light from the projection optical system 14 is not applied to the substrate S.

Figure 7:
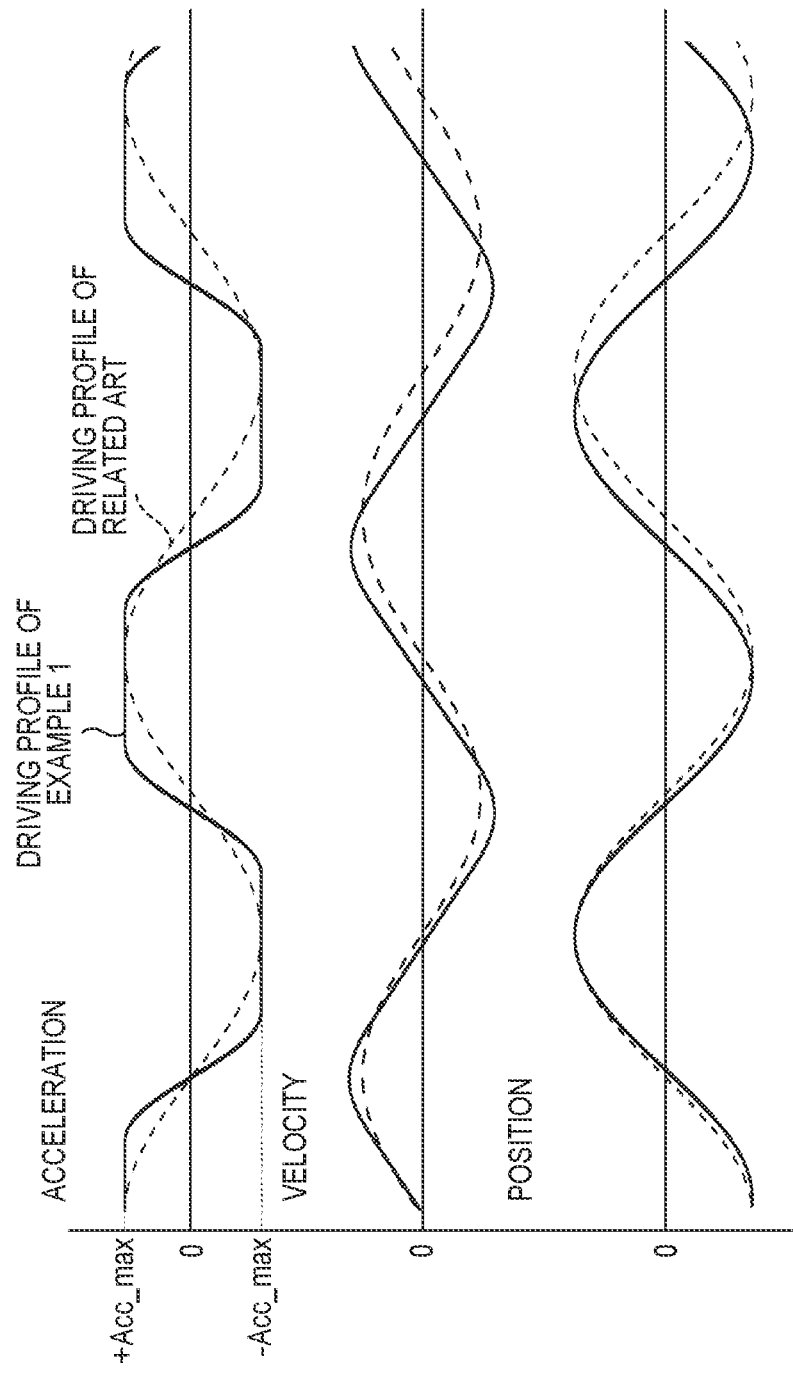
FIG. 7 is a view showing a result obtained by overlapping and comparing the driving profile of Example 1 and the driving profile of the related art.

FIG. 7 shows a result obtained by overlapping and comparing the driving profile of Example 1 shown in FIG. 3 and the driving profile of the related art shown in FIG. 11. In FIG. 7, the acceleration profile is shown in the upper stage, the velocity profile is shown in the middle stage, and the position profile is shown in the lower stage. In FIG. 7, a solid line indicates the driving profile of Example 1, and a dashed line indicates the driving profile of the related art. Further, in FIG. 7, the maximum acceleration Acc_max of the driving profile (solid line) of Example 1 is equal to that of the driving profile (dashed line) of the related art. As can be seen from FIG. 7, the cycle of the driving profile (solid line) of Example 1 is shorter than that of the driving profile (dashed line) of the related art. That is, when the driving profile (solid line) of Example 1 is used, as compared to a case in which the driving profile (dashed line) of the related art is used, it is possible to increase the velocity of the substrate stage 15a in scanning exposure of one shot region and, as a result, improve the throughput.

Example 2

Example 2 of the driving profile applied to the exposure apparatus 10 of this embodiment will be described. Example 2 basically takes over the contents described in Example 1, and matters other than those to be described below follow those described in Example 1.

In the driving profile of this embodiment, as has been described above, it is also possible to adjust the time width of the connection section 1 in accordance with the balance (ratio) between shortening of the stage driving time and reduction of the positioning error. For example, when shortening of the stage driving time is prioritized, the setting parameter of the time width can be adjusted so as to decrease the time width of the connection section 1. When reduction of the positioning error is prioritized, the setting parameter of the time width can be adjusted so as to increase the time width of the connection section 1. In Example 2, an example will be described in which reduction of the positioning error of the substrate stage 15a is prioritized and the time width of the connection section 1 is increased as compared to Example 1.

Figure 8:
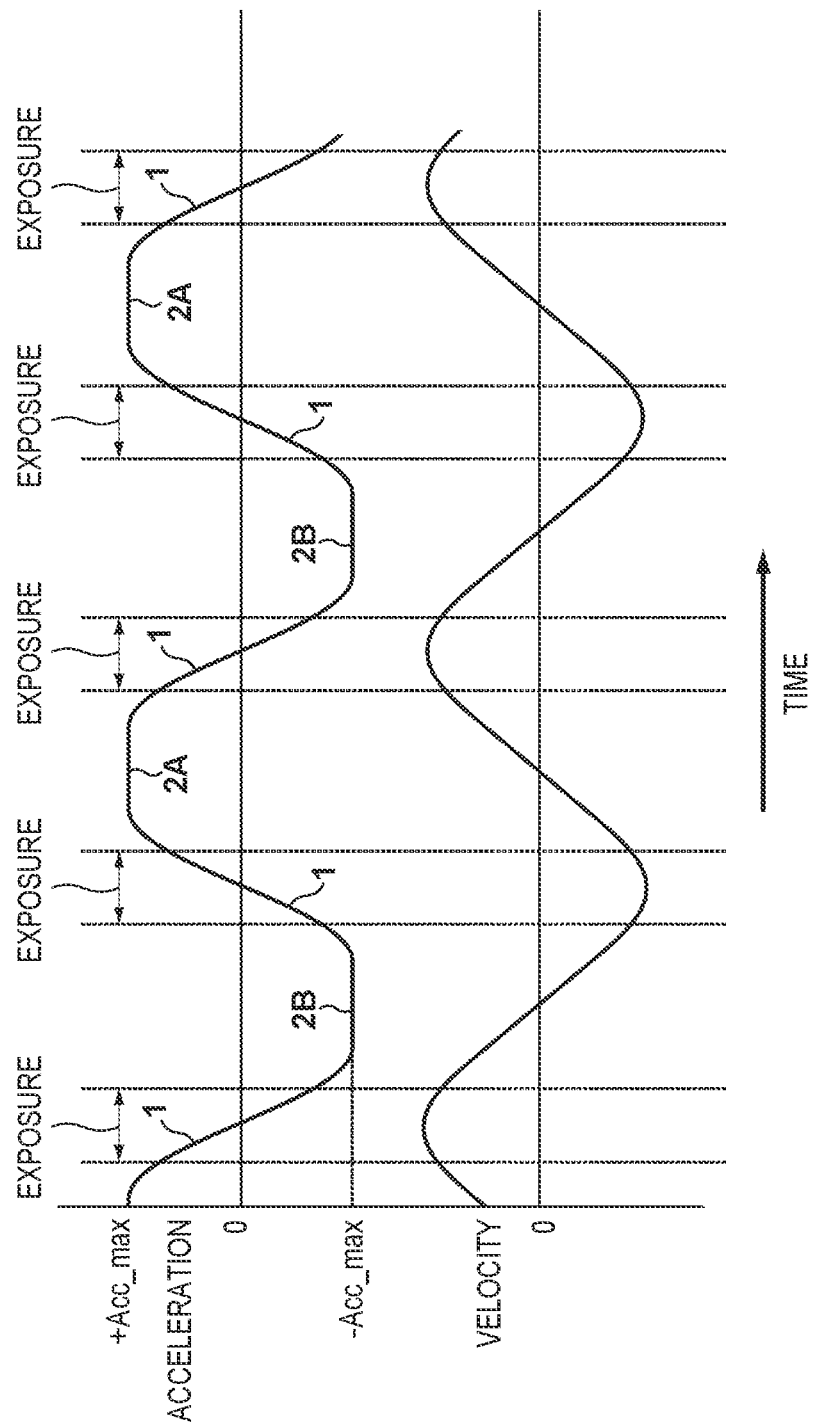
FIG. 8 is a view showing the driving profile of the first embodiment (Example 2)

FIG. 8 is a view showing an example of the driving profile for controlling driving of the substrate stage 15a in the Y-axis direction in the exposure apparatus 10 of this embodiment. FIG. 8 shows only a part of the driving profile used in scanning exposure on the plurality of shot regions of the substrate S. Further, in FIG. 8, the acceleration profile is shown in the upper stage, and the velocity profile is shown in the lower stage.

In the driving profile of Example 2 shown in FIG. 8, as compared to the driving profile of Example 1 shown in FIG. 3, the time width of the connection section 1 is large, and scanning exposure of one shot region is performed in a partial period of the connection section 1. In the driving profile (FIG. 8) of Example 2 as described above, the throughput decreases as compared to the driving profile (FIG. 3) of Example 1 since the stage driving time is longer, but the throughput can be improved as compared to the driving profile (FIG. 11) of the related art. In addition, in the driving profile of Example 2, the control followability of the substrate stage 15a can be improved as compared to the driving profile of Example 1, so that the driving profile of Example 2 can be advantageous in reducing the positioning error of the substrate stage 15a. Therefore, in the exposure apparatus 10, when the overlay accuracy is more important than the productivity, it is effective to apply the driving profile of Example 2.

Example 3

Example 3 of the driving profile applied to the exposure apparatus 10 of this embodiment will be described. Example 3 basically takes over the contents described in Examples 1 and 2, and matters other than those to be described below follow those described in Examples 1 and 2. In Example 3, an example will be described in which improving the throughput (shortening the stage driving time) is prioritized so that the time width of the connection section 1 is decreased compared to Example 1.

Figure 9:
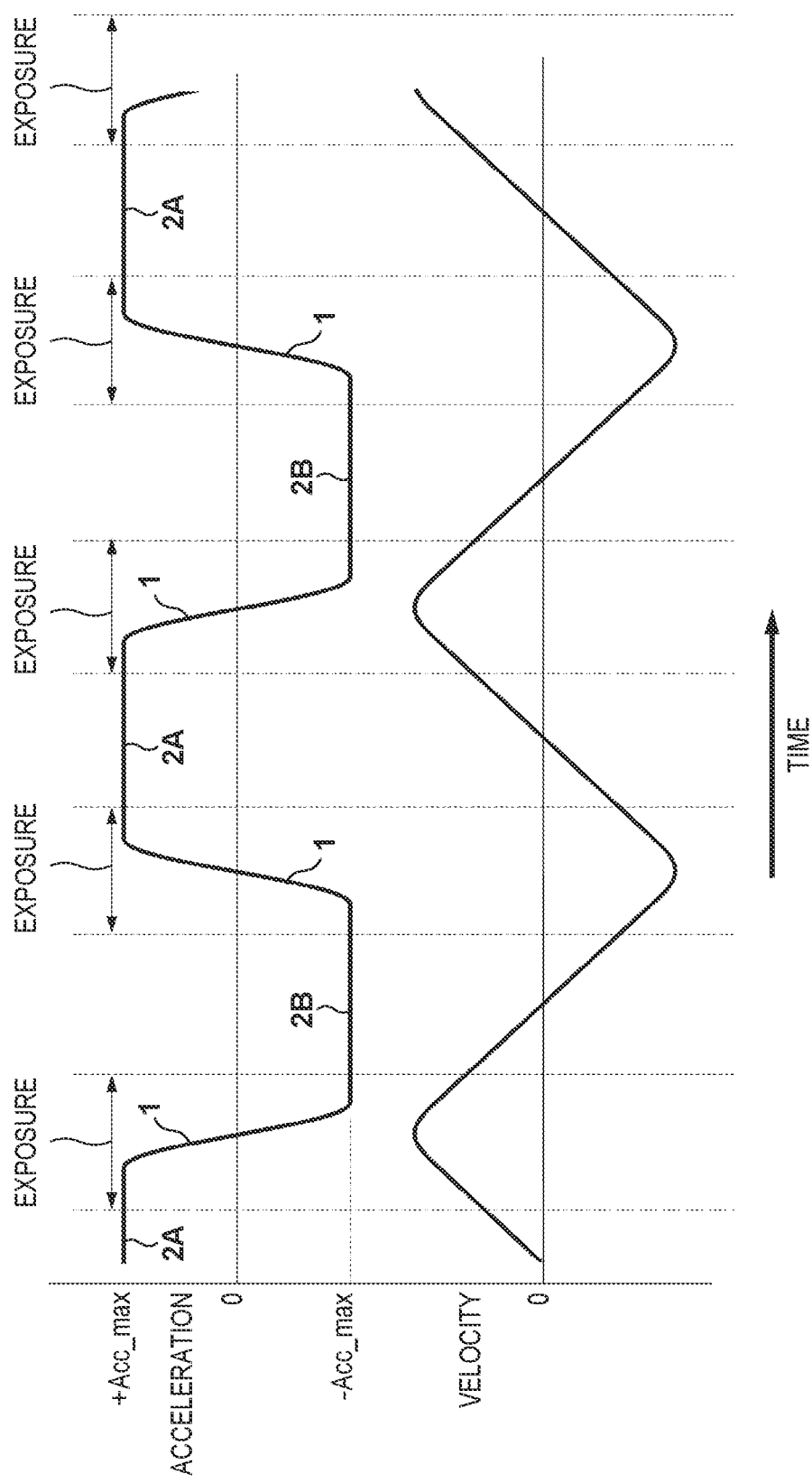
FIG. 9 is a view showing the driving profile of the first embodiment (Example 3)

FIG. 9 is a view showing an example of the driving profile for controlling driving of the substrate stage 15*a* in the Y-axis direction in the exposure apparatus 10 of this embodiment. FIG. 9 shows only a part of the driving profile used in scanning exposure on the plurality of shot regions of the substrate S. Further, in FIG. 9, the acceleration profile is shown in the upper stage, and the velocity profile is shown in the lower stage.

In the driving profile of Example 3 shown in FIG. 9, as compared to the driving profile of Example 1 shown in FIG. 3, the time width of the connection section 1 is small, and scanning exposure of one shot region is performed in a period including the connection section 1 as a part. More specifically, scanning exposure of one shot region is performed in a period including the connection section 1, a part of the first constant acceleration section 2A continuous with the connection section 1, and a part of the second constant acceleration section 2B continuous with the connection section 1. With this, the velocity change of the substrate stage 15*a* during scanning exposure becomes a waveform obtained by combining a linear line and a sine wave. Therefore, although output control of the light source 11 in accordance with the velocity change is required, the ratio of the connection section 1 can be decreased (that is, the stage driving time can be shortened) and the throughput can be improved as compared to the driving profile (FIG. 3) of Example 1. On the other hand, in the driving profile (FIG. 9) of Example 3, as compared to the driving profile (FIG. 3) of Example 1, the cycle of the sine wave forming the connection section 1 decreases, so that the control followability of the substrate stage 15*a* decreases, and the positioning error of the substrate stage 15*a* is likely to occur. Therefore, in the exposure apparatus 10, when the productivity is more important than the overlay accuracy, it is effective to apply the driving profile of Example 3.

Second Embodiment

The second embodiment according to the present invention will be described. In the first embodiment, the example has been described in which the connection section 1 of the driving profile is formed in a sine wave shape. In the second embodiment, an example will be described in which the connection section 1 is formed in a shape other than the sine wave shape. Note that the second embodiment basically takes over the first embodiment, and matters other than those to be described below follow those described in the first embodiment.

FIG. 10 is a view showing an example of the driving profile for controlling driving of a substrate stage 15*a* in the Y-axis direction in an exposure apparatus 10. In the driving profile of this embodiment shown in FIG. 10, a connection section 1 is provided between a first constant acceleration section 2A and a second constant acceleration section 2B, and the connection section 1 is formed in a curved shape expressed by a fourth-order polynomial such that the acceleration of the substrate stage 15*a* changes continuously and smoothly. In the connection section 1, when connecting from the first constant acceleration section 2A to the second constant acceleration section 2B, the acceleration is monotonically changed (decreased) such that the slope (derivative coefficient) of the acceleration becomes negative. Further, in the connection section 1, when connecting from the second constant acceleration section 2B to the first constant acceleration section 2A, the acceleration is monotonically changed (increased) such that the slope of the acceleration becomes positive. The connection section 1 may be understood as a section connecting the first constant acceleration section 2A and the second constant acceleration section 2B with a curve so as not to include a period (constant velocity period) in which the substrate stage 15*a* moves at a constant velocity. That is, in the connection section 1, the acceleration may instantaneously become 0, but a period in which the acceleration is continuously 0 (that is, a period in which the acceleration is 0 and the derivative coefficient of the acceleration is also 0) is not included. In the driving profile as described above, since the curve of the connection section 1 is formed by a low-frequency trigonometric series, the control followability of the substrate stage 15*a* is high, and the positioning error can be reduced. In addition, since the first constant acceleration section 2A and the second constant acceleration section 2B are provided, it is also possible to achieve improvement of the throughput. That is, it is possible to achieve both improvement of the throughput and reduction of the positioning error.

Here, the example in which the connection section 1 is formed in a curved shape expressed by a fourth-order polynomial has been described in this embodiment, but the present invention is not limited to this. The connection section 1 may be formed in a curved shape expressed by a third-order polynomial, or a fifth- or higher-order polynomial. Also in this case, it is desirable that the connection section 1 is formed by a curve that continuously and smoothly connects the first constant acceleration section 2A and the second constant acceleration section 2B, and the acceleration monotonically increases or monotonically decreases in the section. As long as that the positioning error can be reduced to some extent and the first constant acceleration section 2A and the second constant acceleration section 2B can be connected smoothly to some extent, the connection section 1 may be formed by a curve expressed by a first- or second-order polynomial.

Further, the connection section 1 is not limited to a shape expressed by a sine wave or a polynomial. As long as the first constant acceleration section 2A and the second constant acceleration section 2B can be connected such that the acceleration continuously changes (that is, so as not to include a constant velocity period), various curved shapes (waveforms) can be applied. For example, a waveform formed by the square of a sine wave, a cumulative distribution function curve of normal distribution, or the like can be applied to the connection section 1. Further, the connection section 1 may be formed by overlapping a plurality of waveforms, or may be formed by connecting a plurality of waveforms divided at time intervals.

<Embodiment of Manufacturing Method of Article>

A method of manufacturing an article according to the embodiment of the present invention is suitable for manufacturing an article, for example, a microdevice such as a semiconductor device or an element having a microstructure. The method of manufacturing an article according to the embodiment includes a step of forming a latent pattern to a photosensitive agent applied onto a substrate (a step of exposing a substrate) by using the above-described exposure apparatus, and a step of developing (processing) the substrate on which the latent pattern has been formed in the forming step. Furthermore, this manufacturing method includes other well-known steps (for example, oxidization, deposition, vapor deposition, doping, planarization, etching, resist removal, dicing, bonding, packaging, and the like). The method of manufacturing an article according to the embodiment is advantageous in at least one of the performance, quality, productivity, and production cost of the article, as compared with a conventional method.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-115831 filed on Jul. 13, 2021, which is hereby incorporated by reference herein in its entirety.

What is claimed is:

1. An exposure apparatus for performing scanning exposure on each of a plurality of shot regions in a substrate, comprising:
    a stage configured to hold the substrate;
    a driver configured to drive the stage; and
    a controller configured to control the scanning exposure on each of the plurality of shot regions while controlling the driver in accordance with a driving profile for driving the stage,
    wherein the driving profile includes a first constant acceleration section in which velocity of the stage is changed at a first constant acceleration in a first direction, a second constant acceleration section in which velocity of the stage is changed at a second constant acceleration in a second direction opposite to the first direction, and a connection section connecting the first constant acceleration section and the second constant acceleration section such that an acceleration of the stage in the connection section continuously changes,
    in a period including at least a part of the connection section, the scanning exposure on one shot region among the plurality of shot regions is performed.

2. The apparatus according to claim 1, wherein
the controller is configured to adjust a time width of the connection section, in accordance with one selected among a first case in which reduction of driving time of the stage is prioritized and a second case in which reduction of a positioning error of the stage is prioritized, such that the time width of the connection section in the first case is narrower than that in the second case.

3. The apparatus according to claim 2, wherein
the controller is configured to adjust, as the time width of the connection section, a ratio of time of the connection section with respect to total time of the connection section and one of the first constant acceleration section or the second constant acceleration section.

4. The apparatus according to claim 1, wherein
the connection section in the driving profile is formed in a curved shape that causes the acceleration of the stage to monotonically change between the acceleration in the first constant acceleration section and the acceleration in the second constant acceleration section.

5. The apparatus according to claim 1, wherein
the connection section in the driving profile is formed in a sine wave shape.

6. The apparatus according to claim 1, wherein
the connection section in the driving profile is formed in a shape expressed by a polynomial.

7. The apparatus according to claim 1, wherein
the connection section in the driving profile is formed in a point-symmetric curved shape with a center point of the connection section as a point of symmetry.

8. The apparatus according to claim 1, wherein
the connection section in the driving profile is formed such that, when the connection section is decomposed into a trigonometric series, a frequency of the trigonometric series is not higher than a bandwidth of a control system of driving of the stage.

9. The apparatus according to claim 1, wherein
the driving profile is formed by a differentiable curve in an entire range.

10. The apparatus according to claim 1, wherein
the scanning exposure on the one shot region is performed in a partial period of the connection section.

11. The apparatus according to claim 1, wherein
the scanning exposure on the one shot region is performed in a period including the entire connection section, a part of the first constant acceleration section continuous with the connection section, and a part of the second constant acceleration section continuous with the connection section.

12. The apparatus according to claim 11, wherein
in the period including at least a part of the connection section, the scanning exposure on the one shot region is performed while driving the stage in the first direction.

13. The apparatus according to claim 11, wherein
a direction in which the stage moves in the first constant acceleration section changes from the second direction to the first direction, and a direction in which the stage moves in the second constant acceleration section changes from the first direction to the second direction.

14. The apparatus according to claim 1, wherein
an absolute value of the acceleration of the stage in the first constant acceleration section and/or the second constant acceleration section of the driving profile is set to a maximum acceleration at which the driver can drive the stage.

15. The apparatus according to claim 1, wherein
the connection section connects the first constant acceleration section and the second constant acceleration section with a curve so as not to include a period in which the stage moves at a constant velocity.

16. A method of manufacturing an article, the method comprising:
   forming a pattern on a substrate by using an exposure apparatus according to claim 1;
   processing the substrate, on which the pattern has been formed, to manufacture the article.

\* \* \* \* \*